United States Patent
Tetzlaff et al.

(10) Patent No.: US 7,499,513 B1
(45) Date of Patent: Mar. 3, 2009

(54) METHOD AND APPARATUS FOR PROVIDING FREQUENCY SYNTHESIS AND PHASE ALIGNMENT IN AN INTEGRATED CIRCUIT

(75) Inventors: David E. Tetzlaff, Minnetonka, MN (US); F. Erich Goetting, Cupertino, CA (US); Steven P. Young, Boulder, CO (US); Marwan M. Hassoun, Austin, TX (US); Moises E. Robinson, Austin, TX (US)

(73) Assignee: Xilinx, Inc., San Jose, CA (US)

( * ) Notice: Subject to any disclaimer, the term of this patent is extended or adjusted under 35 U.S.C. 154(b) by 772 days.

(21) Appl. No.: 11/049,329

(22) Filed: Feb. 2, 2005

Related U.S. Application Data

(60) Provisional application No. 60/638,682, filed on Dec. 23, 2004.

(51) Int. Cl.
*H04L 7/00* (2006.01)
*H03L 7/06* (2006.01)

(52) U.S. Cl. ...................... 375/358; 327/156

(58) Field of Classification Search ................ 375/219, 375/220, 354, 355, 356, 359, 371, 373–376, 375/316, 322, 324, 326, 327, 327.358; 370/351, 370/366, 360, 357; 326/39, 37; 327/141, 327/144, 146, 147, 155, 156
See application file for complete search history.

(56) References Cited

U.S. PATENT DOCUMENTS

| | | | |
|---|---|---|---|
| 5,369,376 A * | 11/1994 | Leblebicioglu | ................. 331/8 |
| 5,389,898 A * | 2/1995 | Taketoshi et al. | ............... 331/2 |
| 5,838,749 A * | 11/1998 | Casper et al. | ................ 375/376 |
| 6,775,342 B1 | 8/2004 | Young et al. | |
| 6,777,979 B1 * | 8/2004 | Zhu et al. | ...................... 326/41 |
| 7,046,056 B2 * | 5/2006 | Kizer et al. | ................. 327/147 |
| 7,061,939 B1 * | 6/2006 | Chengson et al. | ............ 370/503 |
| 7,288,972 B1 * | 10/2007 | Esposito et al. | .............. 327/105 |
| 7,366,267 B1 * | 4/2008 | Lee et al. | ...................... 375/354 |
| 2002/0031113 A1 * | 3/2002 | Dodds et al. | ................. 370/352 |
| 2002/0075980 A1 * | 6/2002 | Tang et al. | ................... 375/372 |

(Continued)

OTHER PUBLICATIONS

U.S. Appl. No. 60/638,682, filed Dec. 23, 2004, Tetzlaff et al.

(Continued)

*Primary Examiner*—Tesfaldet Bocure
*Assistant Examiner*—Vineeta S Panwalkar
(74) *Attorney, Agent, or Firm*—LeRoy D. Maunu; Kim Kanzaki; Lois D. Cartier

(57) ABSTRACT

According to particular example embodiments, an integrated circuit includes one or more serializing data transmitters. Each such data transmitter is arranged to transmit data on a respective data output port of the integrated circuit, wherein the respective data output port for at least one of the data transmitters is dedicated to transmitting periodic data used for clocking a respective target circuit. In other particular embodiments involving feedback, phase-locked loop (PLL) signal control and/or delay-locked loop (DLL) signal control is achieved in functional blocks of a programmable logic device (PLD). The PLD is responsive to a source clock and includes a configurable logic array that includes configurable logic blocks and configurable routing blocks, and the respective data output port for at least one of the data transmitters provides a respective target clock.

25 Claims, 4 Drawing Sheets

U.S. PATENT DOCUMENTS

2003/0023912 A1* 1/2003 Lesea .................. 714/726
2004/0247022 A1* 12/2004 Raghavan et al. ........... 375/219

OTHER PUBLICATIONS

Xilinx, Inc., "Virtex-4™ RocketIO™ Multi-Gigabit Transceiver User Guide", Appendix A, pp. 1-20, available from Xilinx, Inc. 2100 Logic Drive, San Jose, CA 95124.

Younis, Ahmed et al., "A Low Jitter, Low Power, CMOS 1.25-3.125 Gbps Transceiver", pp. 1-4, available from Xilinx, Inc. 2100 Logic Drive, San Jose, CA 95124.

Xilinx, Inc., RocketIO™ Transceiver User Guide, UG024, Dec. 9, 2004, pp. 1-156, (v2.5), available from Xilinx, Inc. 2100 Logic Drive, San Jose, CA 95124.

* cited by examiner

METHOD AND APPARATUS FOR PROVIDING FREQUENCY SYNTHESIS AND PHASE ALIGNMENT IN AN INTEGRATED CIRCUIT

CROSS REFERENCE

This application claims priority to and incorporates by reference in its entirety the U.S. provisional application entitled "Adaptive Configuration of Serial Communication Transceiver", by David E. Tetzlaff and Marwan M. Hassoun, filed Dec. 23, 2004.

FIELD OF THE INVENTION

This disclosure relates in general to integrated circuits, and more particularly to a method and apparatus for providing clock generation, frequency synthesis and clock phase alignment in an integrated circuit.

BACKGROUND

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

As data transfer speeds have increased, high-speed differential serial lines have replaced large parallel buses in many designs. A Serializer/Deserializer (SERDES) converts parallel data into differential serial data, and differential serial data into parallel data. The interfacing requirements between a parallel data bus and a SERDES IC on a printed circuit board are implemented by a Protocol Controller device. In the transmission of data, transceivers send and receive packets of data on serial data lines. The protocol controller creates or "frames" these packets, which are then sent to the SERDES for transmittal to the data processing logic or memory.

Digital and mixed-signal design typically involves the use of one or more clock signals to synchronize elements across the system. For example, in synchronous digital systems, including board level systems and chip level systems, one or more clock signals are distributed across the system on one or more clock lines. However, due to various problems such as clock buffer delays, high capacitance of heavily loaded clock lines, and propagation delays, the rising edges of a clock signal in different parts of the system may not be synchronized. The time difference between a rising (or falling) edge in one part of the system with the corresponding rising (or falling) edge in another part of the system is referred to as "clock skew".

Clock skew can cause sampled data systems to malfunction. For example, it is common for circuits in digital systems to have a first flip-flop output driving a second flip-flop input. With a synchronized clock on the clock input of both flip-flops, the data in the first flip-flop is successfully clocked into the second flip-flop. However, if the active edge on the second flip flop is delayed by clock skew, the second flip-flop might not capture the data from the first flip-flop before the first flip-flop changes state.

Delay lock loops are used in digital and mix-signal systems to minimize clock skew. Delay lock loops typically use delay elements to synchronize the active edges of a reference clock signal in one part of the system with a feedback clock signal from a second part of the system. As discussed and illustrated in U.S. Pat. No. 6,775,342, a conventional delay lock loop ("DLL"), which includes a delay line and a phase detector, receives a reference clock signal and drives an output clock signal. The delay line delays the reference clock signal by a variable propagation delay before providing the output clock signal. Thus, each clock edge of output clock signal lags a corresponding clock edge of reference clock signal by a certain propagation delay. A phase detector is then used to detect the associated phase difference and to control the delay line over a designated time span ranging from a minimum propagation delay time to a maximum propagation delay time.

Skew in the output clock signal can be caused by delays in various circuits such as clock buffers or propagation delays on the clock signal line that carries the output clock signal (e.g., due to loading on the clock signal line). To distinguish and recover the output clock signal from the skewed version of output clock signal, the skewed clock signal is routed back to a delay lock loop in a feedback path.

The DLL's phase detector controls a delay line to regulate the propagation delay. The actual control mechanism for the DLL can differ. For example, in one version of DLL, the delay line starts with a propagation delay that is equal to a minimum propagation delay, after power-on or reset. The phase detector then increases the propagation delay until the reference clock signal is synchronized with the skewed clock signal.

After synchronizing the reference clock signal and skewed clock signal, the DLL monitors the reference clock signal and the skewed clock signal and adjusts the amount of propagation delay to maintain synchronization. For example, if propagation delay increases, perhaps caused by an increase in temperature, the DLL would decrease the propagation delay to compensate. Conversely, if the propagation delay decreases, perhaps caused by a decrease in temperature, the DLL would increase the propagation delay to compensate. The time in which the DLL is attempting to first synchronize the reference clock signal and skewed clock signal, is referred to as lock acquisition. The time in which the DLL is attempting to maintain synchronization is referred to as lock maintenance. The value of the propagation delay at the end of lock acquisition, i.e. when synchronization is initially established, is referred to as initial propagation delay.

As explained above, the DLL delay line can only provide a propagation delay between a minimum propagation delay and a maximum propagation delay. During lock maintenance, the DLL may lose synchronization if a propagation delay smaller than the minimum propagation delay is required to maintain synchronization. Similarly, synchronization may be lost if a propagation delay greater than the maximum propagation delay is required to maintain synchronization.

To maintain this important signal (frequency) synchronization after lock acquisition, various approaches have been employed. These approaches include, for example, modifying the above-described DLL approach, in accordance with the above-referenced patent document, with the use of a clock phase shifter in addition to the delay line to synchronize the reference clock. The increased flexibility provided by the clock phase shifter increases the range of frequencies at which the DLL will operate.

Another synchronization approach is provided by a phase-locked loop ("PLL") circuit. A common PLL circuit includes a signal phase-frequency detector, a low-pass filter, and a voltage-controlled oscillator (VCO). Normal operation of the PLL occurs in the above-described synchronization maintenance mode, that is, when the VCO frequency is near the incoming frequency. The phase frequency detector generates a signal that indicates if the frequency of the feedback from the VCO is too fast or too slow, and if the phase of the feedback is early or late, compared to the reference clock frequency and phase. The phase frequency detector output signal is integrated by the loop filter to generate the VCO control voltage. This voltage is used to control the VCO output frequency and phase.

An example of a particular PLL circuit that is useful for integrated circuit design is described and illustrated in U.S. Pat. No. 6,542,040 (Austin H. Lesea). This PLL circuit has a relatively wide range of oscillator output frequencies and a relatively wide range of loop divider values. This circuit is advantageous for implementation in integrated form because the total capacitance of its loop filter is small. The PLL includes two phase detectors, a programmable tapped-delay-line oscillator, a divide-by-M loop divider, and a programmable on-chip loop filter. The programmable filter is programmed to realize one of many loop filters. The oscillator output can be fed back via the loop divider to the first phase detector. The oscillator frequency is decremented by changing tap selection inside the oscillator until the first phase detector determines that the frequency of the signal fed back via the loop divider (divide-by-M) is smaller than the frequency of an input signal. The tap control and the programmable loop filter are controlled to realize the selected loop filter and the selected loop filter is switched into a control loop involving the second phase detector. The control loop controls the oscillator to achieve phase lock by varying a supply voltage (or current) supplied to the oscillator.

The electrical characteristics of such PLLs, however, vary over numerous operational conditions including operating frequency, divider value (M), supply voltage VDD, temperature, and process variations. Moreover, PLLs "lock" over a finite range of frequencies, given a particular value of M and a particular loop filter.

As with many other logic blocks, features provided by both PLLs and DLLs can be useful in an FPGA. Apart from frequency synchronization, a PLL can also be useful in a FPGA, if, for example, the PLL is used to do parallel-to-serial conversion. The PLL's output frequency ranges and the selected M may vary widely from user design to user design and, in an FPGA, can be controlled by the user. However useful they might be, FPGA implementations that include both a PLL as well as a DLL can bring with them the above-discussed inherent complexities and potential issues. When these circuits are implemented in FPGAs, other skew-causing variables are introduced and need to be controlled for the integrity of the system.

To address the issues of clock skew and clock distribution, systems designers typically use discrete clock distribution or clock synthesis components in their systems. These discrete components may use DLLs and PLLs to implement the required functions. These components do add cost to the overall system and have limited configurability and adaptability.

SUMMARY OF THE INVENTION

Various embodiments of the present invention address and overcome the issues and problems described above, as well as others that will become apparent upon reading and understanding the present specification. Generally, certain embodiments of the present invention provide methods and apparatuses for clock distribution, phase alignment, and frequency synchronization via high speed serial I/O transceivers.

According to a more particular example embodiment, a programmable clocking arrangement comprises an integrated circuit including a plurality of serializing data transmitters, each arranged to transmit data on a respective data output port of the integrated circuit, wherein the respective data output port for at least one of the data transmitters is dedicated to transmitting periodic data used for low-jitter clocking of a respective target circuit.

According to other particular example embodiments involving feedback, phase-locked loop (PLL) signal control and/or delay-locked loop (DLL) signal control is achieved. In some such embodiments, for example, the integrated circuit is a programmable logic device (PLD) responsive to a source clock and including a configurable logic array that includes configurable logic blocks and configurable routing blocks, and the respective data output port for at least one of the serializing data transmitters provides a respective target clock.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

Figure 1A:
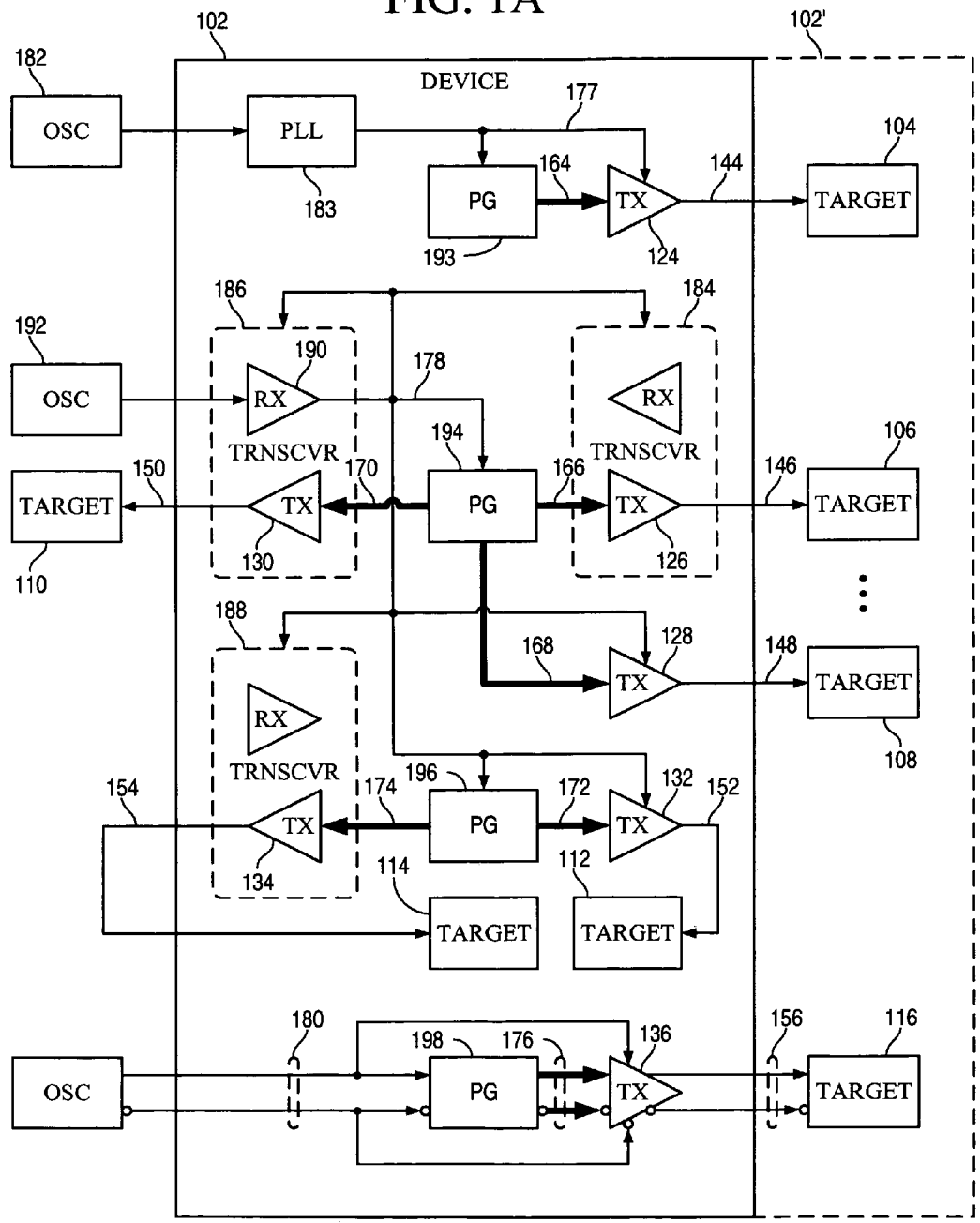
FIG. 1A is a block diagram of a clock distribution example according to an embodiment of the present invention.

FIG. 1A is a block diagram of a clock distribution example according to an embodiment of the present invention. A device 102, which can be a PLD in one embodiment, distributes one or more clocks to targets 104, 106, 108, 110, 112, 114, and 116 using respective data transmitters 124, 126, 128, 130, 132, 134, and 136. It will be appreciated that each of the targets 104 through 116 can include multiple devices. In an alternative embodiment the section 102' having the targets 104-116 can be part of device 102. In yet another embodiment some of the targets can be part of device 102 and some can be external to device 102.

Each data transmitter 124 through 136 is designed to transfer data having an arbitrary data pattern and is not specifically designed to transmit signals that are periodic, such as a clock signal. Generally each data transmitter 124 through 136 can drive a data output, for example data outputs on lines 144 or 156, with a serial data stream of bit values. It will be appreciated that each data transmitter 124 through 136 can transmit multiple bit values in parallel on respective bits of the corresponding data outputs on lines 144 through 156. A data output may be a single-ended, for example the data output on line 144, or differential, for example the data output on lines 156.

Each data transmitter 124 through 136 can have a respective parallel data input on lines 164 through 176 providing the values to be driven and typically can have a clock input on lines 177, 178, or 180 controlling the timing of the driven values. The clock may be at the data rate or at a higher or lower frequency. If a lower frequency reference clock is supplied, it can be multiplied to a rate required for serializing the parallel data using a PLL or DLL. As data transmitter 124 can drive an arbitrary data pattern received at parallel data input 164, possibly including data conversion, such as level shifting and conversion between single-ended signaling and differential signaling.

While data transmitter 124 can transmit an arbitrary data pattern provided at the parallel data input on lines 164, device 102 is arranged to supply a particular data pattern corresponding to a periodic clock waveform to the parallel data input on lines 164 in various embodiments of the invention. In one embodiment, device 102 can be configurable to supply the reference clock from multiple sources to the clock input on line 177, and device 102 is configured to supply a clock signal from a source, such as external oscillator 182, to the clock input on line 177, via PLL 183.

A data transmitter having a clock input and a parallel data input, such as data transmitters 126 through 136, can transmit a specified data pattern supplied at a respective parallel data input on lines 166 through 176 with timing provided by a clock input on lines 178 or 180. A data transmitter 126, 130, or 134 may be included in a respective transceiver 184, 186, and 188 and have timing controlled by the transceiver's clock input on line 178. Each data transmitter 126 through 136 includes circuitry, such as a serializer, that allows data to be transmitted on the data outputs on lines 146 through 156 at a different data rate than the data is received on parallel data inputs on lines 166 through 176. For example, data transmitters 126 through 136 can receive parallel data on respective data inputs on lines 166 through 176 at receive rate and transmit serial data on data outputs on lines 146 through 156 at a transmit rate. The transmit rate can be higher than the receive rate by a factor equal to the width of the parallel data.

Each data transmitter 126 through 136 or device 102 can include circuitry, such as a DLL or a PLL, to generate clocks to establish the receive rate and/or the transmit rate. The device 102 can include a DLL or a PLL to generate the clock supplied to data transmitters 126 through 136 on lines 178 or 180, and each data transmitter 126 through 136 can include a DLL or a PLL to generate additional clocks from the supplied clock on lines 178 or 180. Typically, a DLL or a PLL is provided an input clock and can generate an output clock with a frequency that is a ratio of integers of the frequency of the input clock. For certain DLL or PLL, the ratio of integers may be configurable over a range. A PLL can attenuate and effectively eliminate the jitter in the input clock that has a jitter frequency that is higher than the loop bandwidth of the PLL.

An example of a transceiver 184 having data transmitter 126 is disclosed in Appendix A of U.S. provisional application entitled "Adaptive Configuration of Serial Communication Transceiver", by David E. Tetzlaff, et. al, filed Dec. 23, 2004 which is herein incorporated by reference.

Figure 1B:
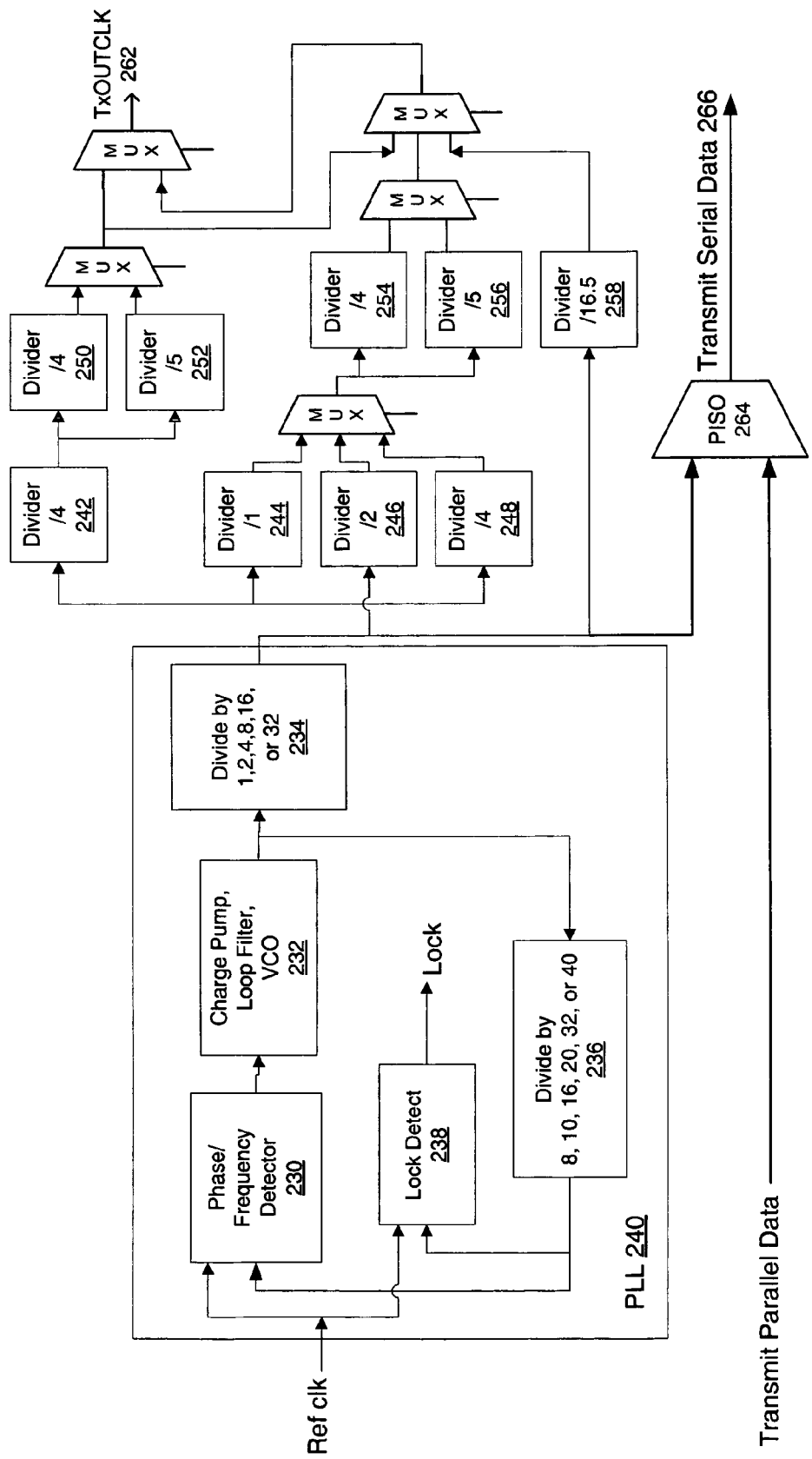
FIG. 1B is clock-generating circuit of an embodiment of the present invention.

FIG. 1B is clock-generating circuit of an embodiment of the present invention. The clock generating circuit can be part of TX 126 in FIG. 1A. The target 106 can be one of the blocks of the configurable logic array of the PLD 102 or the target 106 can be a device external to PLD 102. Hence TX 126 in this embodiment generates a clock for Target 106 via data output line 146. The clock generating circuit of FIG. 1B includes a PLL 240 coupled to a parallel to serial output (PISO) block 264 and a plurality of divider circuits 242, 244, 246, 248, 250, 252, 254, 256, and 258 via multiplexers (MUXs). The PLL includes a phase/frequency detector 230 coupled to a charge pump, loop filter, and VCO block 232, which is coupled to two divide by circuits 234 and 236. A reference clock (ref clk) which may be generated by a pattern generator PG 166 is input into the PLL 240. The clock generating circuit and PISO outputs a clock via the transmit serial data 266 or the transmitter output clock (TxOUTCLK) 262, which is sent to target 106. The parameters in divide by circuits 234 and 236 and the select values for the multiplexers can be set by configuration memory cells in a PLD or dynamically at the operating clock rate or a combination thereof.

Each data transmitter 124 through 136 can provide transmit emphasis. Typically, transmit emphasis drives a serial data value following a transition in data values with a stronger drive level than a serial data value that does not follow a transition. For certain data transmitters 124 through 136, the strength of the stronger drive level can be selected. Transmit emphasis is typically used in serial data transfer to emphasize the high-frequency component of the serial data stream to compensate for the increased losses for the high-frequency components of the serial data stream in, for example, the transmission media. In one embodiment, the transmit emphasis for a clock driven on data output lines 146 through 156 compensates for losses in the clock distribution network. In another embodiment, a selectable transmit emphasis is selected to control the waveform shape of the clock, such as the edge rate for transitions of the clock, for various purposes, such as minimizing reflections due to discontinuities in the transmission media for the clock distribution network.

In various embodiments of the invention, some or all data transmitters, such as data transmitters 126, 130, and 134 can be included in respective data transceivers 184, 186, and 188 that can provide bi-directional data communication. A data receiver, for example data receiver 190 of transceiver 186, can be used to receive a clock signal from an external source 192, and clock signals driven by data transmitters 126 through 134 on respective lines 146 through 154 can be derived from the clock signal received from external source 192. It will be appreciated that a data receiver that is not included in a data transceiver can also be used to receive a clock from an external source.

A de-serializing data receiver, such as data receiver 190, can include a PLL that is capable of locking onto data transitions in a received data signal, such that the PLL can also lock onto transitions in the clock signal received from oscillator 192 and can filter high-frequency jitter in the received clock signal. The PLL can include a variable frequency oscillator (VFO), such as a VCO, controlled by a control parameter having a locked value when the PLL is locked onto received transitions. Typically, the PLL can lock onto transitions in the clock signal received from oscillator 192 when the control parameter has a value near the locked value. The PLL can begin the acquisition of a lock to the received transitions by initializing the control parameter to the expected locked value based on the expected frequency for the clock signal received from oscillator 192. An example of a PLL is given in "A Low Jitter, Low Power, CMOS 1.25-3.125 Gbps Transceiver" by Ahmed Younis, et. al of Xilinx, Inc., at the European Solid State Circuit Conference 2001, which is herein incorporated by reference. An example of a transceiver 186 is given in RocketIO™ Transceiver User Guide UG024 Dec. 9, 2004, of Xilinx Inc., which is incorporated by reference. Yet another example of a transceiver is given in co-pending, commonly assigned U.S. Provisional application entitled "Adaptive Configuration of Serial Communication Transceiver," by David E. Tetzlaff, et. al., filed Dec. 23, 2004, which is herein incorporated by reference.

Each data transmitter 124 through 136 can provide a clock signal on a respective data output 144 through 156 to an external target 104, 106, 108, 110, or 116, or an internal target 112 or 114. An internal target 112 can be directly driven within device 102 by the clock signal on respective data output 152 from data transmitter 132, or an internal target 114 can be indirectly driven by the clock signal, which is routed out of device 102 and back into device 102, on respective data output 154 from data transmitter 134. If the clock signal is being routed within the device, the route clock signal can also be a signal internal to the transmitter other than the data output lines, for example a pre-output driver signal or a PLL generated clock.

Generally, each data transmitter 124 through 136, when supplied with appropriate data on the respective parallel data input on lines 164 through 176 can transmit a clock signal on respective data output on lines 144 through 156 with a clock frequency that is a maximum of one-half the transmit data rate of the data transmitter 124 through 136. To produce a clock frequency that is one-half the transmit data rate, the data supplied on the respective data input on lines 164 through 176 can typically have a data value that alternates between a zero-value and a one-value. The appropriate data values, such as alternating data values, can be supplied by pattern generators 193, 194, 196, and 198.

Pattern generators 193, 194, 196, and 198 can generated more complex patterns than alternating between a zero-value and a one-value. For example, to produce a clock with a frequency that is one-quarter the transmit rate (a clock period of 4 times the data transmit period) for the respective data transmitter 126 through 136, a pattern generator 194, 196, and 198 can alternate between two successive zero-values and two successive one-values. In general, a pattern generator 193, 194, 196, and 198 can generate data for any clock period that is greater than twice the data transmit period.

Figure 2:
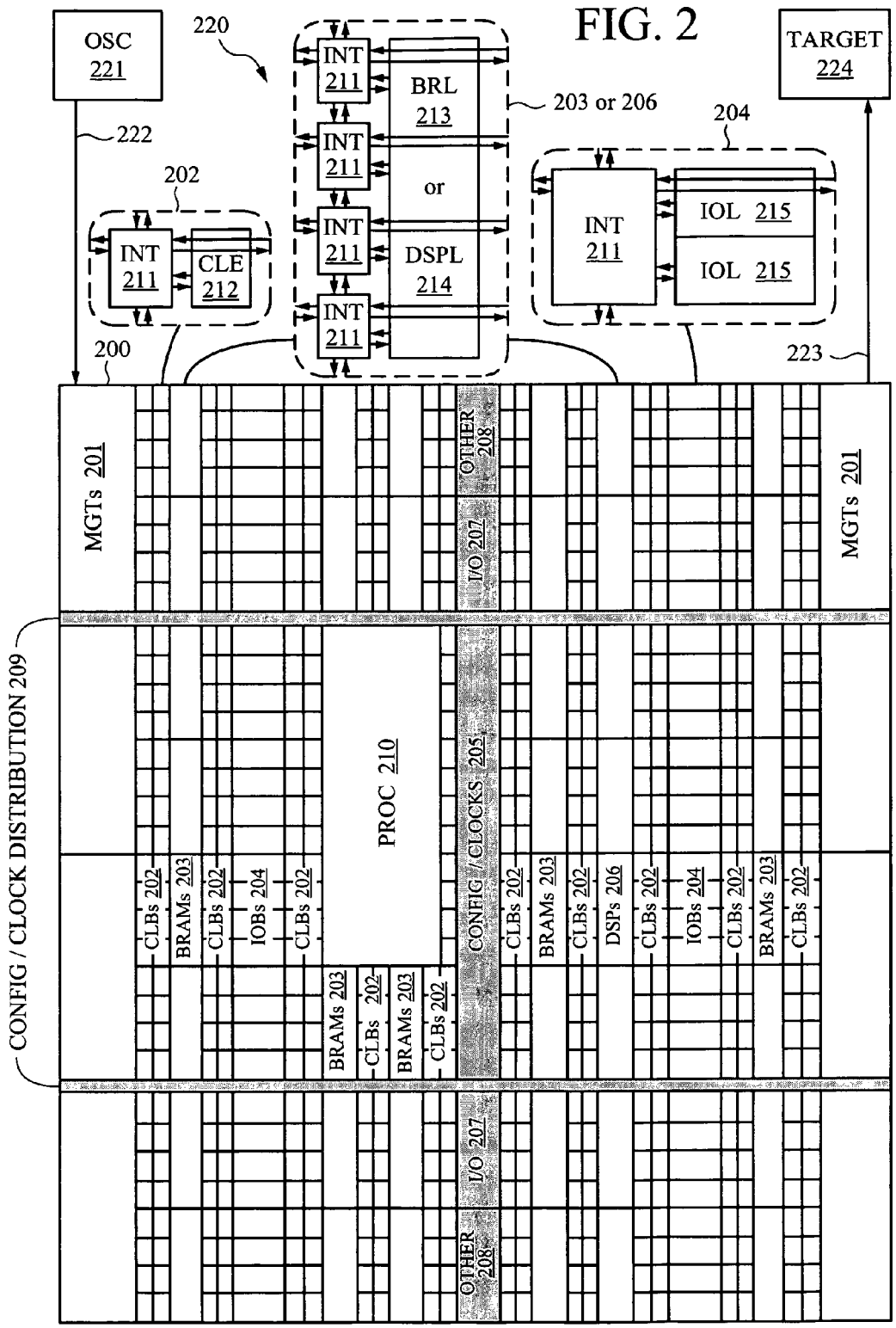
FIG. 2 is a block diagram of clock distribution using an exemplary FPGA according to an embodiment of the present invention.

FIG. 2 is a block diagram of clock distribution using an exemplary FPGA 200 according to an embodiment of the present invention. The FPGA 200 includes multiple serializing multi-gigabit transceivers (MGTs 201) with a data receiver of one of the MGT 201 receiving a source clock on line 222 from an oscillator 221 and a data transmitter of another one of the MGT 201 providing a transmit clock, which is based on the source clock, on line 223 to a target 224. Alternatively, only a receiver of an MGT 201 may be used to acquire the source clock for internal use on the FPGA 200, or only the transmitter of an MGT 201 may used with another FPGA 200 clock being used for the transmitter reference clock.

Advanced FPGAs can include several different types of programmable logic blocks in the array. For example, FIG. 2 illustrates an FPGA architecture 200 that includes a large number of different programmable tiles including multi-gigabit transceivers (MGTs 201), configurable logic blocks (CLBs 202), random access memory blocks (BRAMs 203), input/output blocks (IOBs 204), configuration and clocking logic (CONFIG/CLOCKS 205), digital signal processing blocks (DSPs 206), specialized input/output blocks (I/O 207) (e.g., configuration ports and clock ports), and other programmable logic 208 such as digital clock managers, analog-to-digital converters, system monitoring logic, and so forth. Some FPGAs also include dedicated processor blocks (PROC 210).

In some FPGAs, each programmable tile includes a programmable interconnect element (INT 211) having standardized connections to and from a corresponding interconnect element in each adjacent tile. Therefore, the programmable interconnect elements taken together implement the programmable interconnect structure for the illustrated FPGA. The programmable interconnect element (INT 211) also includes the connections to and from the programmable logic element within the same tile, as shown by the examples included at the top of FIG. 2.

For example, a CLB 202 can include a configurable logic element (CLE 212) that can be programmed to implement user logic plus a single programmable interconnect element (INT 211). A BRAM 203 can include a BRAM logic element (BRL 213) in addition to one or more programmable interconnect elements. Typically, the number of interconnect elements included in a tile depends on the height of the tile. In the pictured embodiment, a BRAM tile has the same height as four CLBs, but other numbers (e.g., five) can also be used. A DSP tile 206 can include a DSP logic element (DSPL 214) in addition to an appropriate number of programmable interconnect elements. An IOB 204 can include, for example, two instances of an input/output logic element (IOL 215) in addition to one instance of the programmable interconnect element (INT 211). As will be clear to those of skill in the art, the actual I/O pads connected, for example, to the I/O logic element 215 are manufactured using metal layered above the various illustrated logic blocks, and typically are not confined to the area of the input/output logic element 215.

In the pictured embodiment, a columnar area near the center of the die (shown shaded in FIG. 2) is used for configuration, clock, and other control logic. Horizontal areas 209 extending from this column are used to distribute the clocks and configuration signals across the breadth of the FPGA.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, the processor block PROC 210 shown in FIG. 2 spans several columns of CLBs and BRAMs.

Note that FIG. 2 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 2 are purely exemplary. For example, in an actual FPGA more than one adjacent column of CLBs is typically included wherever the CLBs appear, to facilitate the efficient implementation of user logic.

It will be appreciated that a pattern generator, such as pattern generators 194, 196, and 198 of FIG. 1A, can be implemented in user logic by appropriately programming one or more of the programmable logic blocks, such as CLBs 202. It will be appreciated that a clock generated by a MGT 201 at a data output, such as the data output on line 223, can be routed to programmable logic blocks, for example, CLBs 202, BRAMs 203, IOBs 204, DSPs 206, and PROC 210.

In various other embodiments of the invention, FPGA 200 blocks, such as 202, 203, 206, and 210, can be used to further enhance the functionality of the clock distribution and synthesis functions.

Figure 3:
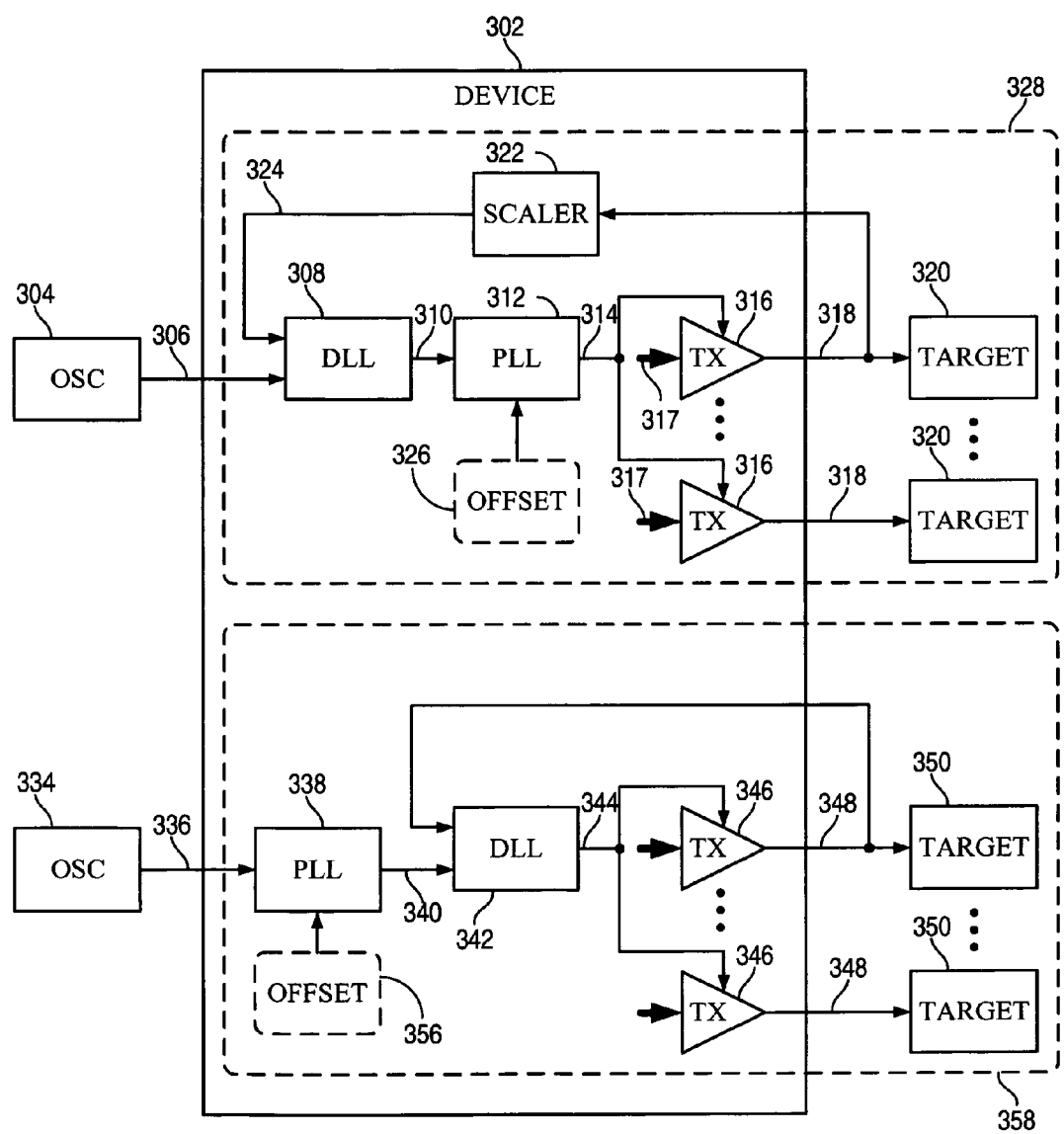
FIG. 3 is a block diagram of clock distribution using a DLL and a PLL according to an embodiment of the present invention.

FIG. 3 is a block diagram of clock distribution using a DLL and a PLL according to an embodiment of the present invention. A device 302 can use a PLL to synthesize a clock frequency and a DLL to adjust the phase of the synthesized clock.

In one embodiment, a clock source 304, such as an oscillator or a crystal, provides a source clock on line 306 to a DLL 308. The DLL 308 produces a reference clock on line 310 with a phase offset from the source clock or a multiplication of the frequency on line 306, as discussed below. A PLL 312 synthesizes a synthesized clock on line 314 from the reference clock on line 310. The synthesized clock on line 314 can have a frequency that multiplies the frequency of the reference clock on line 310 by a ratio of integers, with the ratio of integers possibly selectable. For example, the PLL 312 can support ratios with a numerator that is one of 8, 10, 16, 20, 32, and 40, and a denominator that is the product of one of 1, 2, 4, 8, 16, and 32 times one of 8, 10, 16, 16.5, and 20. It will be appreciated that the frequency multiplication is not limited to these rational number ratios. Other ratios or finite precision real numbers multipliers can be used. The synthesized clock on line 314 is used as the transmit clock for at least one data transmitter 316.

Each data transmitter 316 can also have a data input 317 that provides data to be transmitted with timing controlled by the transmit clock on line 314. While data transmitters, such as data transmitters 316, are capable of transmitting arbitrary data, data transmitters 316 are supplied with data causing the data transmitters 316 to transmit periodic data on lines 318 to target 320. Target 320 typically receives the periodic data on a line 318 at a clock input as a target clock and uses the target clock on the line 318 to clock internal circuits.

Feedback for the target clock on line 318 can be supplied to the DLL/PLL sub-system, with an optional scaler 322 used to match the frequency to the reference clock. The fanout from PLL 312 to data transmitters 316 on line 314 can provide a first level of a clock distribution tree that can have an insertion delay that is nominally balanced between destinations. Data transmitters 316 may include circuitry to limit the skew between data outputs on lines 318 and this circuitry can be used to limit the skew between the target clocks on lines 318. Each target 320 can also contain a portion of the clock distribution tree. The target clock on line 318 received by scaler 322 can monitor a representative destination for the clock distribution tree, and thus nominally monitor the phase of the target clock on lines 318 at all destinations. The DLL 308 may require that the feedback clock on line 324 have the same frequency as the source clock on line 306. Scalar 322 can generate the feedback clock on line 324 from the target clock on line 318 by, for example, dividing the target clock on line 318 by an integer corresponding to the integer the PLL 312 multiplies the reference clock on line 310 to generate the synthesized clock on line 314.

The feedback clock on line 324 may represent the phase of the target clock on lines 318 at one or more destinations. DLL 308 can adjust the phase of the reference clock on line 310 to align the phase of the feedback clock on line 324 to the phase of the source clock on line 306, thereby aligning the phase of the target clock on lines 318 at one or more destinations to the phase of the source clock on line 306. Thus, clock skew is reduced between the source clock on line 306 and a destination of the target clock on line 318.

Typically, a PLL includes a voltage controlled oscillator (VCO) or similar variable frequency oscillator, with a control voltage from a charge pump circuit that acts to align the phases of the synthesized clock and the reference clock. In certain embodiments, the PLL acts to maintain a selectable phase offset between the synthesized clock and the reference clock by the injection of a selectable offset current 326 into the phase detection circuitry of the PLL. The selectable phase offset may be used in addition to or instead of the phase adjustment provided by the DLL 308. The DLL 308 can be a programmable delay element providing a selectable quantized delay in an alternative embodiment.

The clock source 304 can supply a clock to multiple circuits 328, with each circuit 328 possibly including only one data transmitter 316 and one target 320. Skew between the target clock 318 of each circuit 328 may be limited by the appropriate selection of an offset current 326 for each circuit 328, by appropriate selection of a compensating phase delay for the DLL 308 of each circuit 328, or by appropriate selection of a compensating delay for a programmable delay element that is substituted for DLL 308 in each circuit 328 in an alternative embodiment.

In another embodiment, a clock source 334 provides a source clock on line 336 to a PLL 338. A PLL 338 synthesizes a synthesized clock on line 340 by using the source clock on line 336 as a reference clock with a phase shift potentially selected by offset current 356. A DLL 342 produces a transmit clock on line 344 with a phase offset from the synthesized clock on line 340. At least one data transmitter 346 uses the transmit clock on line 344 to transmit periodic data on the target clock on line 348 to target 350.

Feedback for the target clock on line 348, which represents the phase of the target clock on line 348 at all destinations, is received by DLL 342. DLL 342 can produce the transmit clock on line 344 by phase shifting the synthesized clock on line 340 to match the phase of the feedback on line 348. The phase shift by DLL 342 may compensate or dynamically compensate for delays in the clock distribution network with, for example, one of 256 possible phase shifts. The DLL 342 can be a programmable delay element providing a selectable quantized delay in an alternative embodiment.

The clock source 334 can supply a clock to multiple circuits 358, with each circuit 358 possibly including only one data transmitter 346 and one target 350. Skew between the target clock 348 of each circuit 358 may be limited by the appropriate selection of an offset current 356 for each circuit 358, by appropriate selection of a compensating phase delay for the DLL 342 of each circuit 358, or by appropriate selection of a compensating delay for a programmable delay element that is substituted for DLL 342 in each circuit 358 in an alternative embodiment.

In yet another embodiment, the phase of the target clock on line 318 can be adjusted by shifting the periodic data pattern supplied on lines 317. The phase of target clock 318 can be adjusted in discrete steps based on the unit interval (one bit) time resolution of the serializing data transmitter by shifting the periodic parallel data pattern by one or more bits.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A clocking arrangement, comprising:
   an integrated circuit including a plurality of serializing data transmitters, each arranged to transmit data on a respective data output port of the integrated circuit, wherein the respective data output port for at least one of the data transmitters is dedicated to transmitting periodic data used for clocking a respective target circuit,
   wherein the at least one of the data transmitters repeatedly transmits a particular one pattern of data, and only the particular one pattern of data, for the clocking of the respective target circuit;
   wherein the integrated circuit is a programmable logic device (PLD) responsive to a source clock and including a configurable logic array that includes configurable logic blocks and configurable routing blocks, and the respective data output port for the at least one of the serializing data transmitters provides a respective target clock;
   wherein the integrated circuit includes a phase locked loop (PLL) circuit adapted to generate a synthesized clock from a reference clock, wherein the reference clock is based on the source clock and a transmit clock for the transmitting of the periodic data by the at least one of the data transmitters is based on the synthesized clock;
   wherein the integrated circuit includes a delay-locked loop (DLL) circuit coupled to the PLL circuit;
   wherein the DLL circuit is adapted to shift a phase of the source clock to produce the reference clock, and the transmit clock is coupled to the synthesized clock; and
   wherein the DLL circuit is further adapted to align a phase of a feedback clock, which is based on one of the target clocks, to the phase of the source clock.

2. The arrangement of claim 1, further comprising:
   a source circuit adapted to provide the source clock, wherein the integrated circuit is coupled to the source clock.

3. The arrangement of claim 1, wherein the respective target circuit includes at least one device external to the PLD.

4. The arrangement of claim 1, wherein the respective target circuit includes at least one of the blocks of the configurable logic array of the PLD.

5. The arrangement of claim 1, wherein the PLL circuit is further adapted to filter jitter in the reference clock.

6. The arrangement of claim 1, wherein the PLL circuit is further adapted to align a phase of a feedback clock, which is based on one of the target clocks, to a phase of the reference clock.

7. The arrangement of claim 1, wherein each of the at least one of the data transmitters is adapted to provide a selectable transmit emphasis and adjust a waveform shape for the respective target clock using the selectable transmit emphasis.

8. The arrangement of claim 1, wherein the PLL circuit is adapted to generate the synthesized clock having a frequency corresponding to a frequency of the reference clock multiplied by a ratio of selectable integers.

9. The arrangement of claim 1, wherein the PLL circuit is adapted to generate the synthesized clock having a frequency corresponding to a frequency of the reference clock multiplied by a real number of finite precision.

10. The arrangement of claim 1, wherein the DLL circuit is adapted to shift a phase of the synthesized clock to produce the transmit clock, and the reference clock is coupled to the source clock.

11. The arrangement of claim 1, wherein the at least one data transmitter is arranged to provide a dynamically selectable phase for the transmitting of the periodic data with at least 4 phase values for the dynamically selectable phase.

12. The arrangement of claim 1, wherein the at least one data transmitter is arranged to provide a dynamically selectable frequency for the transmitting of the periodic data with a plurality of frequency values for the dynamically selectable frequency.

13. The arrangement of claim 1, wherein the integrated circuit includes a data receiver coupled to a clock source, adapted to receive periodic data and generate a receive clock, and arranged to receive the source clock.

14. The arrangement of claim 13, wherein the integrated circuit includes a second phase locked loop (PLL) circuit associated with the data receiver and adapted to lock onto data transitions in the data during the receiving by the data receiver.

15. The arrangement of claim 14, wherein the second PLL circuit is arranged to filter jitter in the source clock.

16. The arrangement of claim 14, wherein the second PLL circuit includes a variable frequency oscillator adapted to generate the receive clock based on a frequency control parameter, wherein a locked value for the frequency control parameter causes the variable frequency oscillator to generate the receive clock at a frequency that corresponds to a frequency of the source clock and the second PLL circuit is adapted to initialize the frequency control parameter to a value approximating the locked value.

17. The arrangement of claim 1, wherein:
   the integrated circuit includes a pattern generator adapted to generate a periodic data pattern having a period that is a multiple of a period of the source clock,
   the at least one of the data transmitters is arranged to transmit the periodic data pattern, and
   the at least one of the data transmitters is arranged to transmit the periodic data pattern for the clocking of the respective target circuit.

18. The arrangement of claim 17, wherein the periodic data pattern includes a series of bit intervals that alternate between a zero-value and a one-value.

19. The arrangement of claim 1, wherein the at least one of the data transmitters is a plurality of the data transmitters that are each adapted to control the skew between the target clocks.

20. The arrangement of claim 1, wherein the at least one of the data transmitters is a plurality of the data transmitters and the integrated circuit includes a plurality of phase-locked loop (PLL) circuits each associated with one of the plurality of the data transmitters and adapted to generate a respective transmit clock from a respective reference clock, wherein each respective transmit clock is coupled to the respective target clock and the integrated circuit is adapted to control skew between the target clocks by controlling a respective phase of each reference clock relative to the source clock.

21. The arrangement of claim 20, wherein the integrated circuit includes a plurality of quantized delay elements each associated with one of the plurality of the data transmitters and arranged to control the respective phase of each reference clock relative to the source clock.

22. The arrangement of claim 20, wherein the integrated circuit includes a plurality of delay-locked loop (DLL) circuits each associated with one of the plurality of the data transmitters and arranged to control the respective phase of each reference clock relative to the source clock.

23. The arrangement of claim 1, wherein the at least one of the data transmitters is a plurality of the data transmitters and the integrated circuit includes a plurality of phase-locked loop (PLL) circuits each associated with one of the plurality of the data transmitters and adapted to generate a respective transmit clock from a reference clock, wherein the source clock is coupled to the reference clock, each respective transmit clock is coupled to the respective target clock, and each PLL is adapted to control skew between the target clocks by controlling a respective phase of each transmit clock relative to the reference clock.

24. The arrangement of claim 23, wherein each PLL is arranged to control the respective phase of each transmit clock relative to the reference clock by injecting an offset current in the PLL.

25. The arrangement of claim 1, wherein the integrated circuit includes a pattern generator, the at least one of the data transmitters is a plurality of the data transmitters, the integrated circuit includes a plurality of phase-locked loop (PLL) circuits each associated with one of the plurality of the data transmitters and adapted to generate a respective transmit clock from a reference clock, the source clock is coupled to the reference clock, each respective transmit clock is coupled to the respective target clock, and the pattern generator is adapted to control skew between the target clocks by a respective shifting of the periodic data that is transmitted by each of the plurality of data transmitters.

* * * * *